United States Patent [19]

Ushiyama et al.

[11] Patent Number: 5,416,274
[45] Date of Patent: May 16, 1995

[54] CIRCUIT BOARD

[75] Inventors: Kiyohiko Ushiyama; Shizunori Mitsuma, both of Nagano, Japan

[73] Assignee: Kabushiki Kaisha Sankyo Seiki Seisakusho, Nagano, Japan

[21] Appl. No.: 156,915

[22] Filed: Nov. 24, 1993

[30] Foreign Application Priority Data

Nov. 26, 1992 [JP] Japan ................................ 4-339637

[51] Int. Cl.6 ............................................. H05K 1/00
[52] U.S. Cl. ................................. 174/250; 174/268; 361/784; 361/792
[58] Field of Search ......................... 174/250, 268; 228/180.1; 361/748, 784, 792

[56] References Cited

U.S. PATENT DOCUMENTS 3,597,839  8/1971  Jaccodine .
4,673,773  6/1987  Nakano et al. .
4,899,439  2/1990  Potter et al. .
4,920,639  5/1990  Yee .

Primary Examiner—Leo P. Picard
Assistant Examiner—Cheryl R. Figlin
Attorney, Agent, or Firm—Sughrue, Mion, Zinn, Macpeak & Seas

[57] ABSTRACT

An object of this invention is to provide a circuit board low in manufacturing cost in which aimed circuit patterns having a circuit gap therebetween can be short-circuited substantially irrespective of the length of the circuit gap while being insulated from other circuit patterns which are laid in the circuit gap. In a circuit board on which a plurality of circuit patterns are arranged, a selected one of circuit patterns is cut to have a circuit gap where the selected circuit pattern is laid across the remaining circuit patterns, in such a manner that the circuit gap divides the selected circuit patterns into two parts, a conductor formed by cutting a wire to the length of the circuit gap bridges the circuit gap, to short-circuit the two parts thereby to complete the selected circuit pattern, the conductor being insulated from the remaining circuit patterns laid across the circuit gap.

6 Claims, 3 Drawing Sheets

CIRCUIT BOARD

BACKGROUND OF THE INVENTION

FIELD OF THE INVENTION

This invention relates to circuit boards, and more particularly to the structure of a part of a circuit board where a plurality of circuit patterns cross one another.

RELATED ART

In forming a plurality of circuit patterns on a circuit board, sometimes at least two of the circuit patterns lie across each other. In this case, the following method is employed: One of the circuit patterns is cut where it lies across the other circuit pattern, to have a gap (hereinafter referred to as "a circuit gap", when applicable), and the other circuit pattern is laid through the circuit gap. Under this condition, the circuit gap is bridged with a conductive member. FIG. 9 shows an example of a part of the conventional circuit board where two circuit patterns lie across each other. In FIG. 9, two circuit patterns 21 and 25 on the circuit board are obtained by cutting one circuit pattern into two parts with a circuit gap therebetween; in other words, one circuit pattern is divided into two circuit patterns 21 and 25 by the circuit gap. The circuit patterns 21 and 25 are extended in parallel with each other with a predetermined distance therebetween. The circuit patterns 21 and 25 have soldering lands 21a and 25a at the ends, respectively, which define the circuit gap. Other circuit patterns 23 and 24 are formed between the circuit patterns 21 and 25, which are in parallel with each other as was described above, in such a manner that those circuit patterns 23 and 24 lie across the circuit gap.

The circuit patterns 21 and 25 separated by the circuit gap should be connected to each other. However, since the other circuit patterns 23 and 24 lie across the circuit gap, the circuit patterns 21 and 25 cannot be connected merely with a conductor. Hence, a rectangular chip resistor 22, which is 0 Ω, is connected between the soldering lands 21a and 25a of the circuit patterns 21 and 25. The surface of the rectangular chip resistor 22 is electrically insulated, and the surface of the circuit board on which the circuit patterns have been formed is covered with an insulating layer of resist and silk except the surfaces of the soldering lands 21a and 25a. Therefore, the rectangular chip resistor 22 short-circuiting the circuit patterns 21 and 25 is insulated from the circuit patterns 23 and 24.

In the above-described circuit board, the circuit gap is bridged with the rectangular chip resistor 22; that is, the latter 22 electrically connects the aimed circuit patterns 21 and 25 to each other without electrically contacting the other circuit patterns 23 and 24. However, the use of the rectangular chip resistor 22 suffers from the following difficulties: The rectangular chip resistor 22 is fixed in size; more specifically, it is impossible to adjust the length of the rectangular chip resistor according to the length of the circuit gap. Hence, in the case where there lie a number of circuit patterns in the circuit gap; that is, in the case where the circuit gap is longer than the rectangular chip resistor, it is impossible for the rectangular chip resistor to electrically connect the circuit patterns 21 and 25 to each other. On the other hand, in the case where the number of circuit patterns to be laid across the circuit gap is relatively small, the length of the circuit gap may be reduced as much. However, even in this case, the length of the circuit gap must conform to the length of the rectangular chip resistor 22, which makes it impossible to economically use the space on the circuit board. This difficulty may be eliminated by the provision of a variety of rectangular chip resistors different in length. However, the method will increase the manufacturing cost of the circuit board, because the rectangular chip resistors are expensive.

SUMMARY OF THE INVENTION

Accordingly, an object of this invention is to eliminate the above-described difficulties accompanying a conventional circuit board. More specifically, an object of the invention is to provide a circuit board in which circuit patterns having a circuit gap therebetween can be electrically connected to each other substantially irrespective of the length of the circuit gap while being insulated from other circuit patterns which are laid in the circuit gap.

According to an aspect of the present invention, there is provided a circuit board comprising:

a plurality of circuit patterns arranged in the circuit board;

a selected one of circuit patterns cut to have a circuit gap where the selected circuit pattern is laid across the remaining circuit patterns, in such a manner that the circuit gap divides the selected circuit pattern into two parts;

a conductor formed by cutting a wire to the length of the circuit gap bridging the circuit gap, to short-circuit the two parts thereby to complete the selected circuit pattern; and the conductor being insulated from the remaining circuit patterns laid across the circuit gap.

In the circuit board, the conductor formed by cutting a wire to the length of the circuit gap of the selected circuit pattern is used to bridge the circuit gap to complete the selected circuit pattern. The conductor is not limited in length; that is, the selected circuit pattern can be completed irrespective of the length of its circuit gap.

BRIEF DESCRIPTION OF THE DRAWING(S)

Figures 3A, 3B, 3C, 3D:
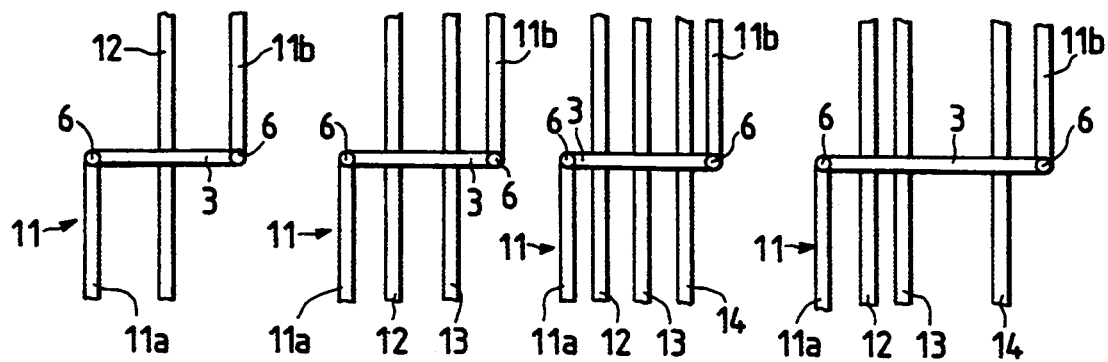
Figure 4:
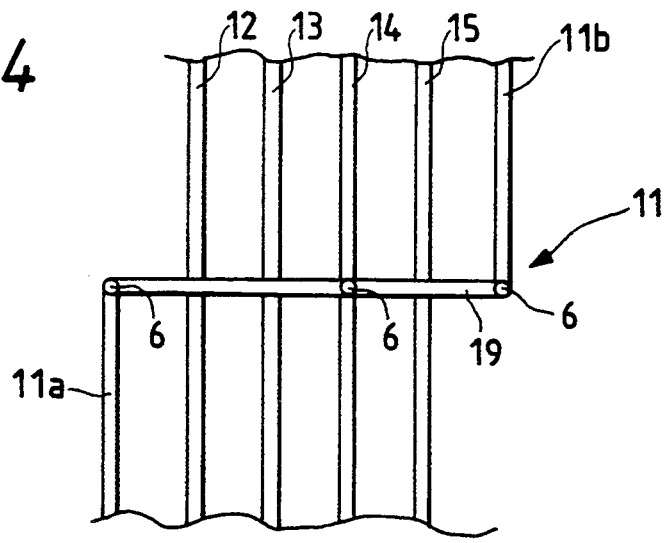
Figure 5:
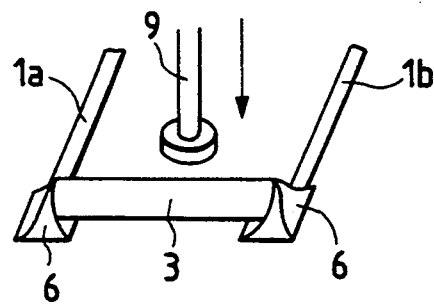
Figure 6:
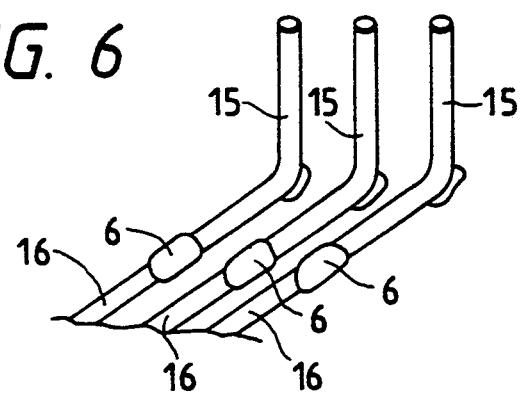
Figure 7:
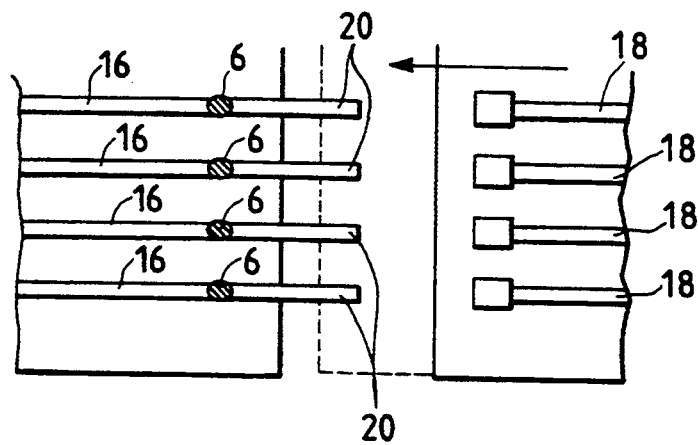
Figure 8:
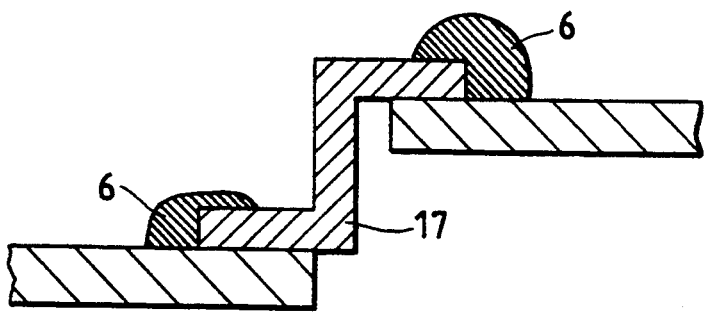
Figure 9:
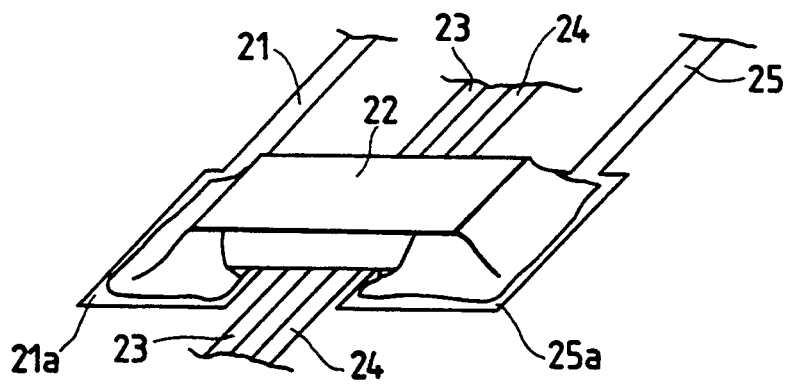

FIG. 3 (a) to (d) are plan views showing examples of the arrangement of circuit patterns on the circuit board;

FIG. 4 is a plan view showing another example of the arrangement of circuit patterns on the circuit board;

FIG. 5 is a perspective view showing an application of the first embodiment of the invention;

FIG. 6 is a perspective view showing another example of the circuit board of a second embodiment of the invention;

FIG. 7 is a plan view showing one modification of the second embodiment of the invention;

FIG. 8 is a side view showing another modification of the second embodiment of the invention; and FIG. 9 is a perspective view showing an example of a conventional circuit board.

DETAILED DESCRIPTION OF THE PREFERRED EMBODIMENTS

Preferred embodiments of this invention will be described with reference to the accompanying drawings.

Figure 1A:
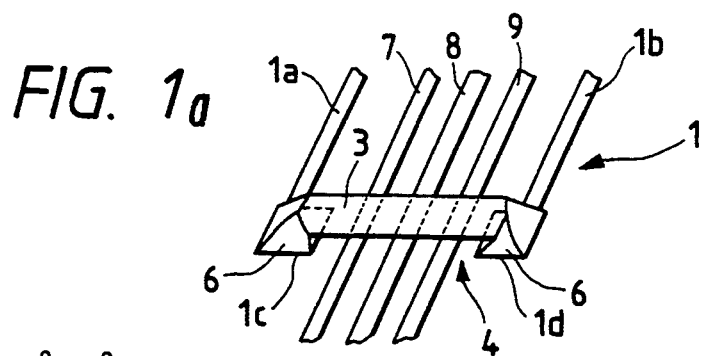
FIG. 1(a) is a perspective view showing an example of a circuit board of first embodiment of this invention.
Figure 1B:
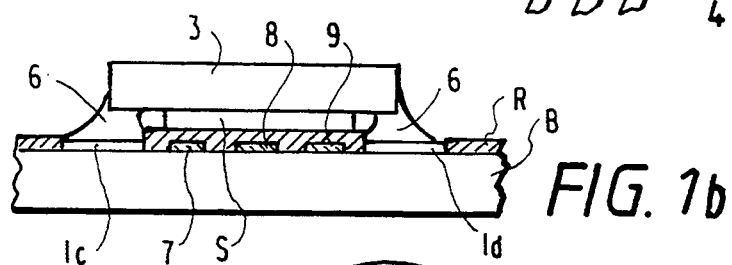
FIG. 1(b) is a cross sectional view of the circuit board of the first embodiment of the invention.

An example of a circuit board, which constitutes a first embodiment of the invention, is as shown in FIGS. 1(a) and 1(b). In FIG. 1(a), reference 1 designates a circuit pattern which is originally U-shaped. The bottom portion (not shown) of the U-shaped circuit pattern 1 is removed, thus providing first and second circuit patterns 1a and 1b with a circuit gap 4 therebetween. In other words, the circuit gap 4 divides the circuit pattern 1 into the first and second circuit patterns 1a and 1b. The ends of the first and second circuit patterns 1a and 1b are slightly extended towards each other, thus forming soldering lands 1c and 1d, respectively. Third, fourth and fifth circuit patterns 7, 8 and 9 are laid across the circuit gap 4 between the first and second circuit patterns 1a and 1b.

Figure 2:
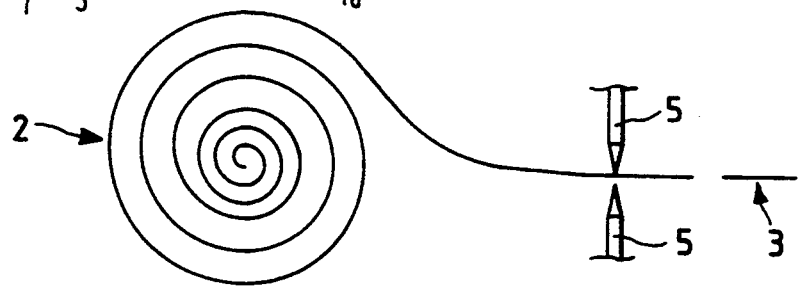
FIG. 2 is a side view showing a method of forming a conductor used in the circuit board of the invention.

A conductor 3 low in resistance is soldered to the lands 1c and 1d of the first and second circuit patterns 1a and 1b so as to electrically connect those patterns 1a and 1b to each other thereby to complete the original circuit pattern 1. In order to prevent the conductor 3 soldered to the lands 1c and 1d of the first and second patterns 1a and 1b from directly contacting the third, fourth and fifth circuit patterns which are laid across the circuit gap 4, a layer of resist R and silk S is formed over the circuit board B except the lands 1c and 1d by printing (see FIG. 1(b)). Hence, the conductor 3 connected between the first and second circuit patterns 1a and 1b is maintained insulated from the other patterns 7, 8 and 9. The conductor 3 is formed by cutting, as indicated at b, a wire 2 wound on a reel to a length corresponding to the circuit gap 4 (see FIG. 2).

The parts (a) through (d) of FIG. 3 show examples of the arrangement of the circuit pattern 11 divided into the first and second circuit patterns 11a and 11b by a circuit gap, and other circuit patterns laid across the circuit gap. In the case of the part (a) of FIG. 3, only one circuit pattern 12 is laid across the circuit gap; in the case of the part (b) two circuit patterns 12 and 13 are laid across the circuit gap; and in the case of the part (c) three circuit patterns 12, 13 and 14 are laid across the circuit gap. In the case of the part (d), too, three circuit patterns 12, 13 and 14 are laid across the circuit gap. However, it should be noted that in the case of the part (d), the space between the circuit patterns 13 and 14 is larger than in the case of the part (c). As is seen from the parts (a) through (d) of FIG. 3, even if the number of circuit patterns laid across the circuit gap is increased, or even when the length of the circuit gap is increased depending on the arrangement of the circuit patterns laid across the latter, the conductor 3 is long enough to bridge the circuit gap, because it is formed by cutting the wire 3 to the length of the circuit gap. Thus, the technique of the invention, unlike the conventional art of using the rectangular chip resistor which is applicable only to the circuit gap predetermined in length, can be widely applied to a variety of circuit patterns having circuit gaps. Since the conductor 3 is lower in manufacturing cost than the rectangular chip resistor, the employment of the conductor 3 results in a reduction in the manufacturing cost of the circuit board. The conductor 3 may be utilized as a test point, on which, as shown in FIG. 5, a test needle 9 is set to test the circuit pattern.

FIG. 4 shows another example of the arrangement of circuit patterns on the circuit board.

As shown in FIG. 4, a circuit pattern 11 is cut into two parts, namely, a first circuit pattern 11a and a second circuit pattern 11b with a circuit gap therebetween. Third through sixth circuit patterns 12, 13, 14 and 15 lie across the circuit gap between the first and second circuit patterns 11a and 11b. Similarly as in the case of the above-described first embodiment, the original circuit pattern 11 is completed with a conductor 19 soldered to the ends of the first and second circuit patterns 11a and 11b. In addition, the conductor 19 is soldered as at 6 to the fifth circuit pattern 14, so that the latter 14 is connected to the circuit pattern 11. That is, the employment of the conductor 19 is advantageous in that the circuit pattern can be completed with the conductor 19 which has been divided into two parts forming the circuit gap, and any one of the circuit patterns lying across the circuit gap can be connected to it. In contrast, in the case of the conventional circuit board, in which the rectangular chip resistor is used to complete the particular circuit pattern which has been divided into two parts forming a circuit gap therebetween, it is impossible to connect the other circuit patterns to the particular circuit pattern when necessary.

A second embodiment of the invention is as shown in FIG. 6. In the second embodiment, conductors 15 on one circuit board are each bent upwardly so that they are three-dimensionally connected to circuit patterns on another circuit board. One modification of the second embodiment is as shown in FIG. 8. In the modification, the conductor 17 is bent twice so as to three-dimensionally connect a circuit pattern on a circuit board to a circuit pattern on another circuit board.

FIG. 7 shows another modification of the second embodiment. In the modification, circuit patterns 16 on a circuit board are connected to conductors 20 by soldering as indicated at 6, respectively, and the free end portions of the conductors 20 are extended outside the circuit board, so that they are soldered to circuit patterns 18 on another circuit board. That is, the circuit patterns on one circuit board are two-dimensionally connected to those on another circuit board.

In each of the above-described embodiments of the invention, the circuit patterns forming the circuit gap therebetween, and the other circuit patterns are in parallel with one another; however, it should be noted that the technical concept of the invention is applicable to a circuit board in which the former circuit patterns lie across the latter circuit patterns. Thus, the technical concept of the invention is applicable to motor circuit boards, and other circuit boards.

As was described above, in the circuit board on which a plurality of circuit patterns are arranged, a selected one of circuit patterns is cut to have a circuit gap where the selected circuit pattern is laid across the remaining circuit patterns, in such a manner that the circuit gap divides the selected circuit pattern into two parts, and the conductor formed by cutting a wire to the length of the circuit gap bridges the circuit gap to short-circuit the two parts thereby to complete the selected circuit pattern, the conductor being insulated from the remaining circuit patterns laid across the circuit gap. Hence, the circuit board in which circuit patterns having a circuit gap therebetween can be short-circuited substantially irrespective of the length of a circuit gap, can be provided at low manufacturing cost according to the invention.

What is claimed is:

1. A circuit board comprising:
   a plurality of circuit patterns arranged in the circuit board and being generally parallel to each other;
   a circuit gap, defined in a selected one of the circuit patterns by cutting thereof, where the selected one of the circuit patterns is laid across the remaining circuit patterns in such a manner that the circuit gap divides the selected one of the circuit patterns into first and second circuit pattern portions; and
   a bridge conductor comprising a precut wire having a length in accordance with a length of the circuit gap, the bridge conductor bridging the circuit gap between said first and second circuit pattern portions to short circuit the selected one of the circuit patterns, said first and second circuit pattern portions being selectively connected by said precut wire irrespective of the length of the circuit gap between said first and second circuit pattern portions, thereby permitting the length of said precut wire to be freely selected.

2. A circuit board as claimed in claim 1, wherein the bridge conductor is insulated from the remaining circuit patterns laid across the circuit gap.

3. A circuit board as claimed in claim 1, wherein the bridge conductor is further electrically connected to at least one of the remaining circuit patterns.

4. A circuit board as claimed in claim 3, wherein the bridge conductor is insulated from the remaining circuit patterns laid across the circuit gap.

5. A first circuit board and a second circuit board, said first and second circuit boards being disposed in different planes, each of said first and second circuit boards comprising a plurality of circuit patterns which are arranged generally parallel to each other; and further comprising a bridge conductor, said bridge conductor comprising a precut wire which is bent twice, wherein one end of said bridge conductor is electrically connected to a selected one of the circuit patterns of said first circuit board and the other end of said bridge conductor is electrically connected to a selected one of the circuit patterns of said second circuit board, so as to achieve a three dimensional connection.

6. A first circuit board and a second circuit board, said first and second circuit boards being disposed in a common plane and spaced apart by a predetermined distance, each of said first and second circuit boards comprising a plurality of circuit patterns which are arranged generally parallel to each other; and further comprising at least one bridge conductor comprising a precut wire, wherein one end of said at least one bridge conductor is electrically connected to a selected one of the circuit patterns of said first circuit board and the other end of said at least one bridge conductor is electrically connected to a selected one of the circuit patterns of said second circuit board, so that said at least one bridge conductor extends between said first and second circuit boards in the common plane.

* * * * *